United States Patent [19]
Ohno

[11] Patent Number: 5,389,802
[45] Date of Patent: Feb. 14, 1995

[54] HETEROJUNCTION FIELD EFFECT TRANSISTOR (HJFET) HAVING AN IMPROVED FREQUENCY CHARACTERISTIC

[75] Inventor: Yasuo Ohno, Tokyo, Japan
[73] Assignee: NEC Corporation, Tokyo, Japan
[21] Appl. No.: 170,868
[22] Filed: Dec. 21, 1993

[30] Foreign Application Priority Data

Dec. 21, 1992 [JP] Japan .................. 4-340062

[51] Int. Cl.⁶ .............. H01L 31/072; H01L 31/109; H01L 31/0328
[52] U.S. Cl. .................... 257/194; 257/183; 257/192
[58] Field of Search .............. 257/192, 194, 183

[56] References Cited

FOREIGN PATENT DOCUMENTS 60-154675 8/1985 Japan .................. 257/194
2-275642 11/1990 Japan .................. 257/192

OTHER PUBLICATIONS

P. Cantfield, et al, "Buried–Channel GaAs MESFET's with Frequency-Independent Output Conductance", *IEEE Electron Device Letters*, vol. EDL–8, No. 3, Mar. 19, 1987, pp. 88–89.

*Primary Examiner*—Steven Ho Yin Loke
*Attorney, Agent, or Firm*—Sughrue, Mion, Zinn, Macpeak & Seas

[57] ABSTRACT

In an n-channel heterojunction field effect transistor (HJFET) comprising a buffer region, a channel layer, and a carrier supplying layer which are deposited on a substrate in this order, the buffer region comprises a p-type GaAs layer, an undoped GaAs layer, and an n-type GaAs layer in this order. The p-type GaAs layer has substantially the same impurity concentration per unit area as the n-type GaAs layer. Holes are depleted in the whole of the buffer region at thermal equilibrium.

3 Claims, 5 Drawing Sheets

5,389,802

HETEROJUNCTION FIELD EFFECT TRANSISTOR (HJFET) HAVING AN IMPROVED FREQUENCY CHARACTERISTIC

BACKGROUND OF THE INVENTION

This invention relates to a field effect transistor (FET) and, in particular, to a heterojunction field effect transistor (HJFET) such as a high electron mobility transistor (HEMT).

A heterojunction field effect transistor is typically fabricated by successively growing crystal layers on a semi-insulating substrate in the molecular beam epitaxy (MBE) process or the like. The hetero-junction field effect transistor comprises a buffer region, a channel layer, and a carrier supplying layer which are successively deposited on the principal surface of the semi-insulating substrate in this order. Both of the channel layer and the carrier supplying layer determine a characteristic of the heterojunction field effect transistor. The buffer region between the semi-insulating substrate and the channel layer has a secondary function for diffusion prevention of impurity in the substrate and for suppression of the short channel effect.

In a compound semiconductor such as GaAs, there is an interface level between the substrate and an epitaxial growth layer. The interface level has a time constant for response which is longer than one micro second and which is extremely larger than a speed of the transistor itself. As a result, parasitic phenomena occurs in the transistor that are, for example, frequency dispersion of drain conductance, hysteresis, drain lag and so on. Such phenomena are especially disadvantageous in a digital integrated circuit (IC) which is operable in a wide band including zero frequency, namely, a direct current (DC). It results in drastic degradation of operational speed of the transistor in design stage.

Similar phenomena occur in a metal semiconductor field effect transistor (MESFET) where the channel layer is directly formed in the semi-insulating substrate which includes a deep level. In order to eliminate such phenomena, a P-type layer is formed on a bottom surface of the channel layer in the MESFET. Such an MESFET is contributed by P. Canfield et al to IEEE ELECTRON DEVICE LETTERS, Vol. EDL-8, No. 3 (March 1987), pages 88–89, and which has a title of "Buried-Channel GaAs MESFET's with Frequency-Independent Output Conductance." In the MESFET, a threshold voltage rises due to introduction of the P-type layer. Such a rise of the threshold voltage is prevented by increasing of impurities in the channel layer.

However, in a heterojunction field effect transistor (HJFET) which uses charges supplied from the carrier supplying layer, the electron density in the channel layer is limited by the electron affinity of the carrier supplying layer. This introduction of the P-type layer in the HJFET results in a rise of the threshold voltage, an increment of resistance in both of source and drain electrodes, and so on, therefore such HJFET is not operable at high speed. In addition, when an N-type layer is used as the channel layer, a scattering of the impurities occurs and a characteristic of high electron mobility is therefore lost.

SUMMARY OF THE INVENTION

It is therefore an object of this invention to provide a heterojunction field effect transistor which is capable of improving wide range frequency characteristics thereof by introducing a P-type layer.

It is another object of this invention to provide a heterojunction field effect transistor of the type described, which has a buffer region without reduction of density of electric charge in a channel layer and without reduction of electron mobility.

Other objects of this invention will become clear as the description proceeds.

According to an aspect of this invention, a heterojunction field effect transistor (HJFET) of a first conductive type comprises a buffer region, a channel layer, and a carrier supplying layer which are deposited on a principal surface of a substrate in this order. The buffer region comprises a first impurity-doped layer, an undoped layer laid on a top surface of the first impurity-doped layer, and a second impurity-doped layer laid on a top surface of the undoped layer. The first impurity-doped layer is made of a second conductive type while the second impurity-doped layer is made of the first conductive type. The first and the second impurity-doped layers having substantially the same impurity concentration per unit area. Carriers of the second conductive type are depleted in the whole of the buffer region at thermal equilibrium.

The introduction of the first impurity-doped layer having the second conductive type arise energy band in both of the buffer region and the substrate. It is possible to prevent reduction of channel charges due to the introduction of the first impurity-doped layer having the second conductive type by compensating for this reduction using charges in the second impurity-doped layer having the first conductive type. In addition, carriers flow in the channel layer having high mobility without flowing the second impurity-doped layer having the first conductive type when the first and the second impurity-doped layers have suitable impurity concentration.

This effect is accomplished because the first impurity-doped layer has the same charge density per unit area as the second impurity-doped layer. When the impurity density of the first conductive type is higher than that of the second conductive type, carriers flow in the second impurity-doped layer and it therefore results in reduction of mobility. In addition, inasmuch as the channel charges sink into the buffer region, it results in increment of the short channel effect and degradation of the pinch-off characteristic. When the impurity density of the second conductive type is higher than that of the first conductive type, it results in reduction of carrier density in the channel layer. Alternatively, carriers of the second conductive type occur and it results in increment of the parasitic capacitance between source and drain electrodes.

The undoped layer is inserted between the first and the second impurity-doped layers to control height of the energy band in the buffer region. When the undoped layer is thin, the energy band becomes not high in the bottom portion of the buffer region and it results in reduction of merit of the frequency dispersion characteristic. When the undoped layer is too thick, carriers of the second conduction type occur and it causes increment of the parasitic capacitance and degradation of the frequency dispersion characteristic. It is therefore necessary to design by precise numerical calculation and to highly control the thickness and the impurity concentration in epitaxial growth process. This is sufficiently satisfied by the current simulation technique and Molecular Beam Epitaxy (MBE) process.

DESCRIPTION OF THE PREFERRED EMBODIMENT

In an embodiment which will later be described, the description will be made as regards an n-channel field effect transistor (FET). A p-channel FET has a similar structure and operation of the n-channel FET by exchanging a kind of both of carriers and impurities. In addition, the description will be made using results of computer simulations in detail. Similar effects are obtained in actual elements.

Figure 1:
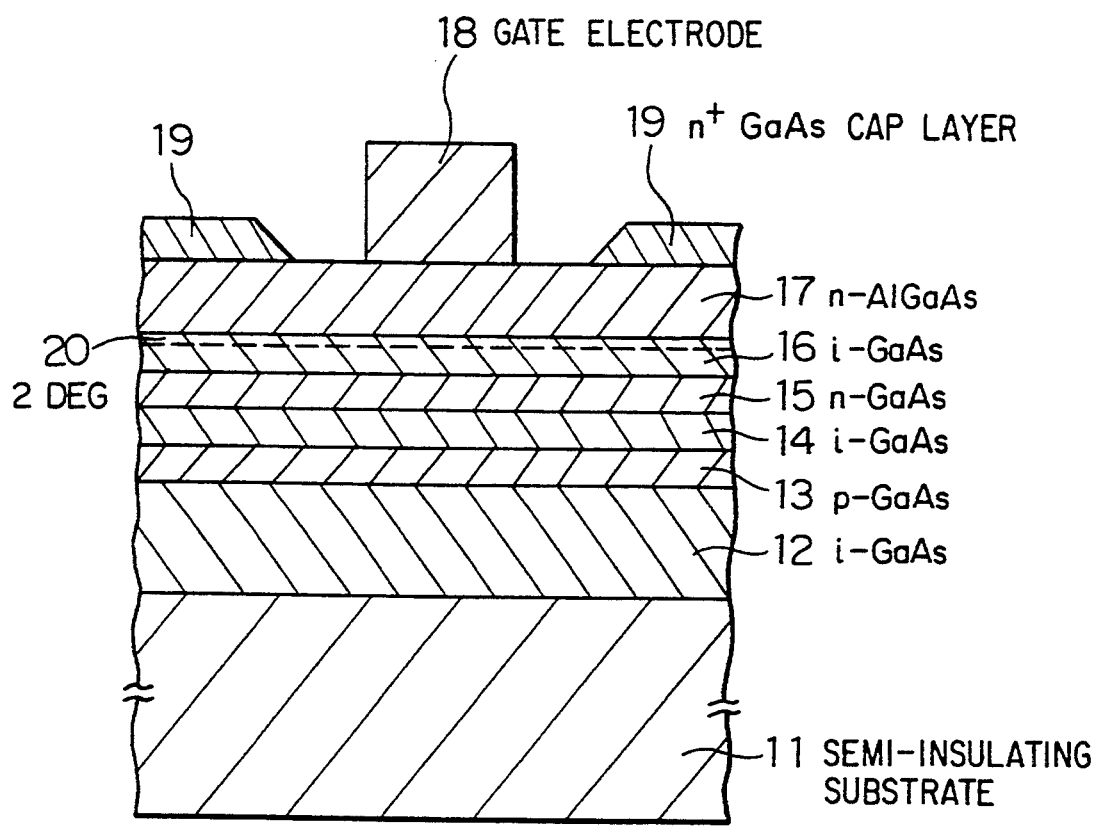
FIG. 1 is a cross-sectional view of a field effect transistor (FET) according to a preferred embodiment of the present invention.

FIG. 1 shows a crystal structure of a field effect transistor (FET) according to a preferred embodiment of this invention. The illustrated FET comprises a semi-insulating substrate 11. The semi-insulating substrate 11 is prepared in a known manner and has the principal surface which is directed upwards of FIG. 1. On the principal surface of the semi-insulating substrate 11, an undoped GaAs layer (i-GaAs) 12, a p-type GaAs layer (p-GaAs) 13, an undoped GaAs layer (i-GaAs)-14, an n-type GaAs layer (n-GaAs) 15, an undoped channel GaAs layer (i-GaAs) 16, and an n-type AlGaAs carrier supplying layer (n-AlGaAs) 17 are deposited in this order. The n-type AlGaAs carrier supplying layer 17 has a top surface on which a gate electrode 18 and n+-type GaAs cap layers 19 are formed. In the n+-type GaAs gap layers 19, one is operable as a source electrode while the other is operable as a drain electrode.

A combination of the undoped GaAs layer 12, the p-type GaAs layer 13, the undoped GaAs layer 14, and the n-type GaAs layer 15 acts as a buffer layer. The p-type GaAs layer 13, the undoped GaAs layer 14, and the n-type GaAs layer 15 are herein collectively called an n-i-p layer. The p-type GaAs layer 13 has substantially the same impurity concentration per unit area as the n-type GaAs layer 15. In the whole of the buffer region, carriers of the p-type (the second conductive type) are depleted at thermal equilibrium. In a heterojunction surface between the undoped channel GaAs layer 16 and the n-type AlGaAs carrier supplying layer 17, a two-dimensional electron gas (2DEG) 20 generates which is used as a channel.

Figure 2:
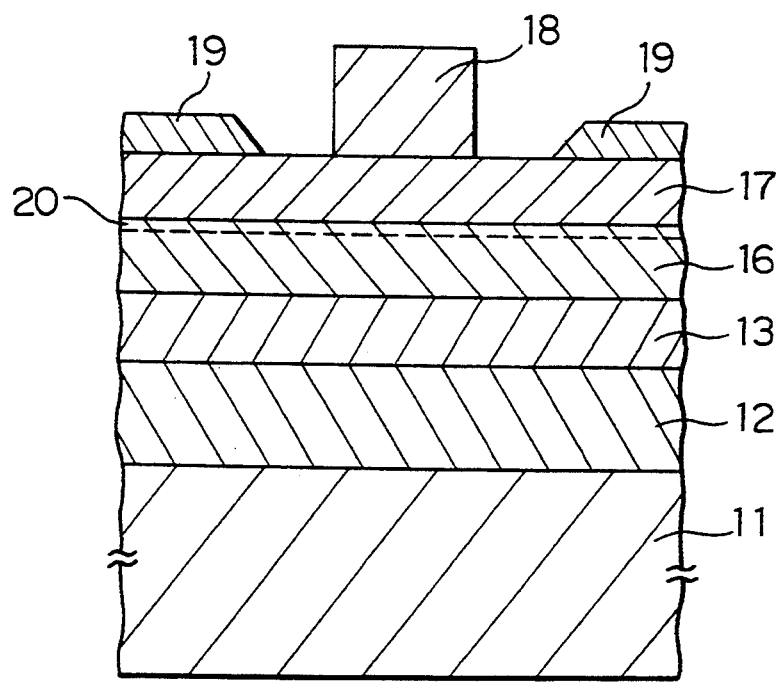
FIG. 2 is a cross-sectional view of a conventional field effect transistor (FET) having a p-type buffer region.
Figure 3:
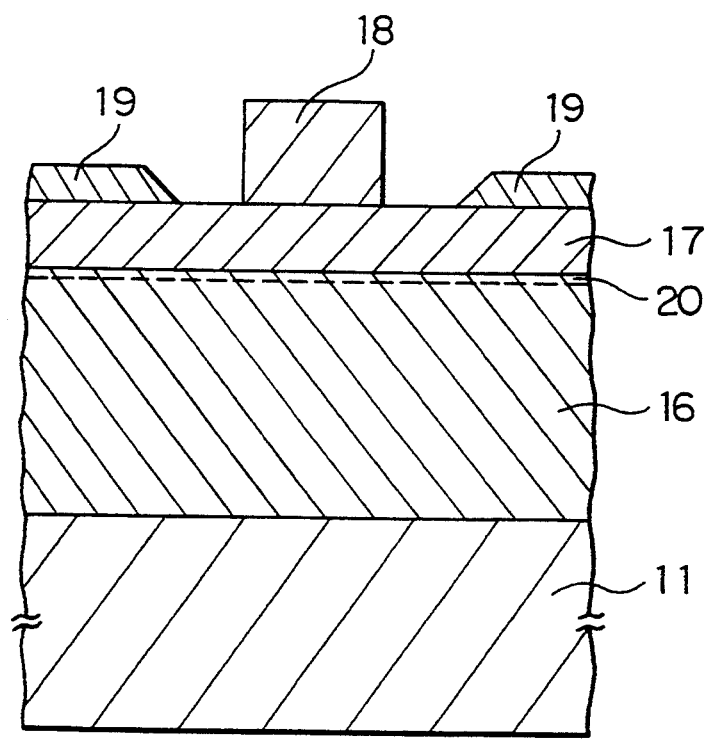
FIG. 3 is a cross-sectional view of a field effect transistor (FET) having an undoped buffer layer.

In comparison with this, FIG. 2 shows a conventional FET having the p-type buffer region which consists of the undoped GaAs layer 12 and the p-type GaAs layer 13. FIG. 3 shows an FET having an undoped buffer layer 16. In FIGS. 2 and 3, similar reference numerals are denoted as regards components which are similar to those of FIG. 1.

Table 1 shows thickness and impurity concentration in crystal structures illustrated in FIGS. 1 through 3. In this event, silicon (Si) is used as the n-type impurity while beryllium (Be) is used as the p-type impurity.

TABLE 1

| STRUCTURE | OF THIS INVENTION (FIG. 1) | CONVENTIONAL p-TYPE BUFFER (FIG. 2) | UNDOPED BUFFER (FIG. 3) |
|---|---|---|---|
| CARRIER SUPPLYING LAYER (17) | AlGaAs 500Å, n-TYPE $1 \times 10^{18}/cm^3$ | | |
| UNDOPED CHANNEL LAYER (16) | 100Å | 500Å | 5000Å |
| n-TYPE LAYER (15) | 100Å, $1 \times 10^{18}/cm^3$ | — | — |
| UNDOPED LAYER (14) | 250Å | — | — |
| p-TYPE LAYER (13) | 100Å, $1 \times 10^{18}/cm^3$ | 500Å, $1 \times 10^{17}/cm^3$ | — |
| UNDOPED LAYER (12) | 5000Å | 5000Å | — |
| SUBSTRATE (11) | SEMI-INSULATING SUBSTRATE | | |

Figure 4:
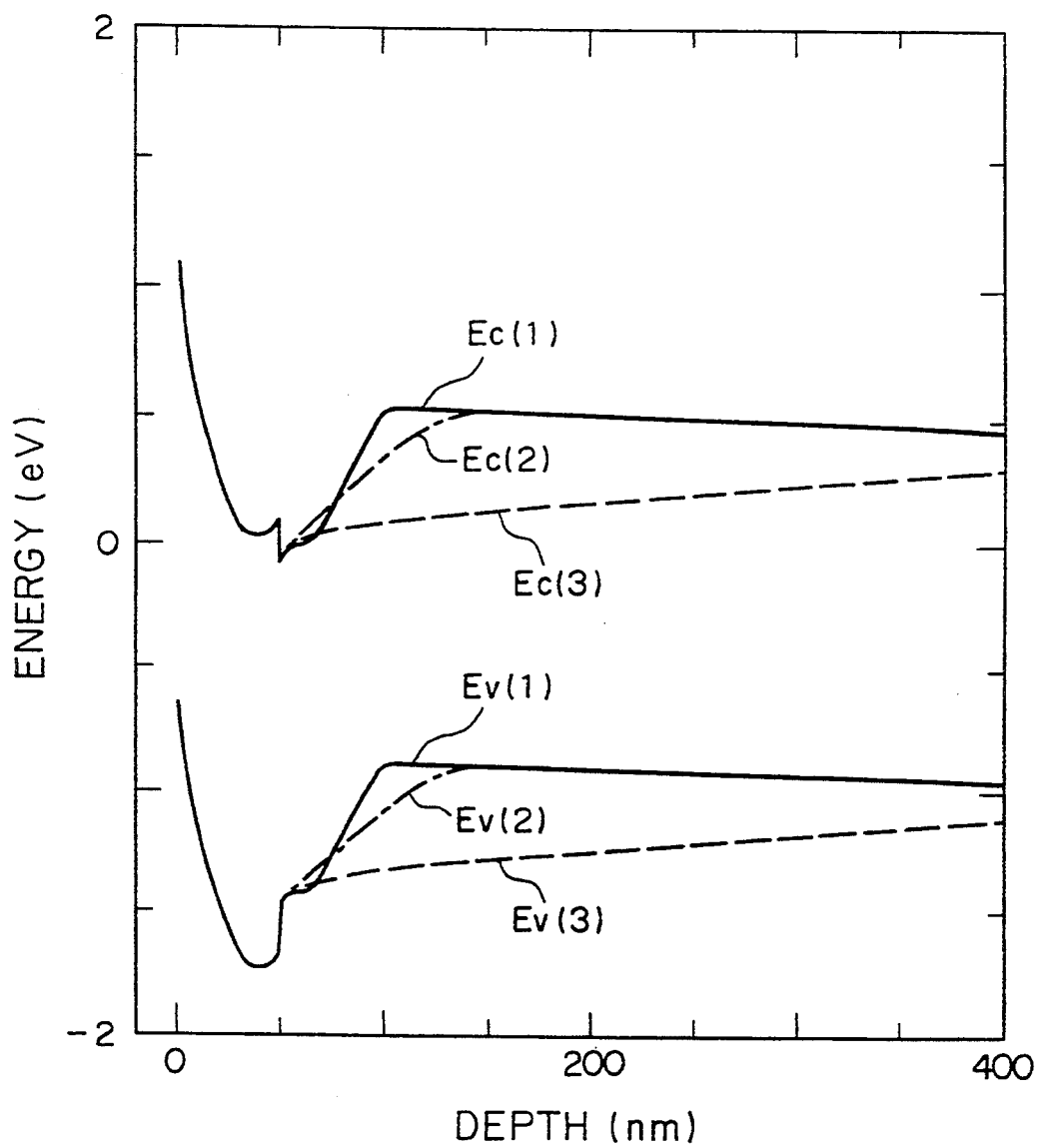
FIG. 4 shows potential of the field effect transistors illustrated in FIGS. 1 through 3 under the thermal equilibrium (Vg=0 V)

FIG. 4 shows potential of the field effect transistors illustrated in FIGS. 1 through 3 under the thermal equilibrium where a gate voltage is equal to zero voltage (Vg=0). In FIG. 4, the abscissa and the ordinate represent the depth (nm) below the channel and the energy (eV), respectively. In FIG. 4, Ec(1) and Ev(1) represent energy of the conduction and valence or filled bands in the FET having the buffer region according to this invention illustrated in FIG. 1, respectively. Similarly, Ec(2) and Ev(2) represent energy of the conduction and valence bands in the conventional FET having the p-type buffer region illustrated in FIG. 2, respectively. Likewise, Ec(3) and Ev(3) represent energy of the conduction and valence bands in the FET having the undoped buffer layer illustrated in FIG. 3, respectively.

Figure 5:
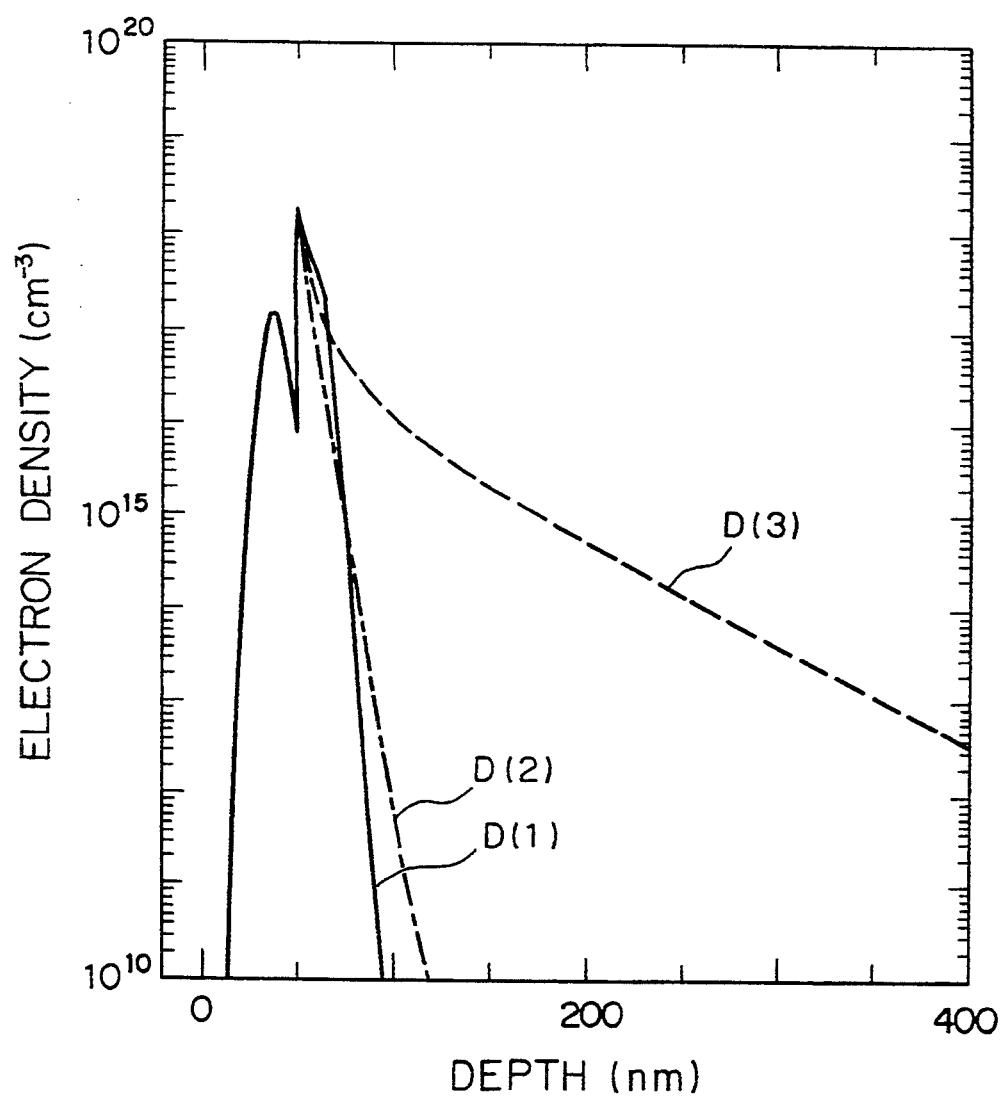
FIG. 5 shows electron density in the field effect transistors illustrated in FIGS. 1 through 3 under the thermal equilibrium (Vg=0 V)

FIG. 5 shows electron density in the field effect transistors illustrated in FIGS. 1 through 3 under the thermal equilibrium where the gate voltage is equal to zero voltage (Vg=0). In FIG. 5, the abscissa and the ordinate represent the depth (nm) below the channel and the electron density (cm$^{-3}$), respectively. In FIG. 5, D(1), D(2), and D(3) represent electronic distribution in the FET's illustrated in FIGS. 1 through 3, respectively.

Figure 6:
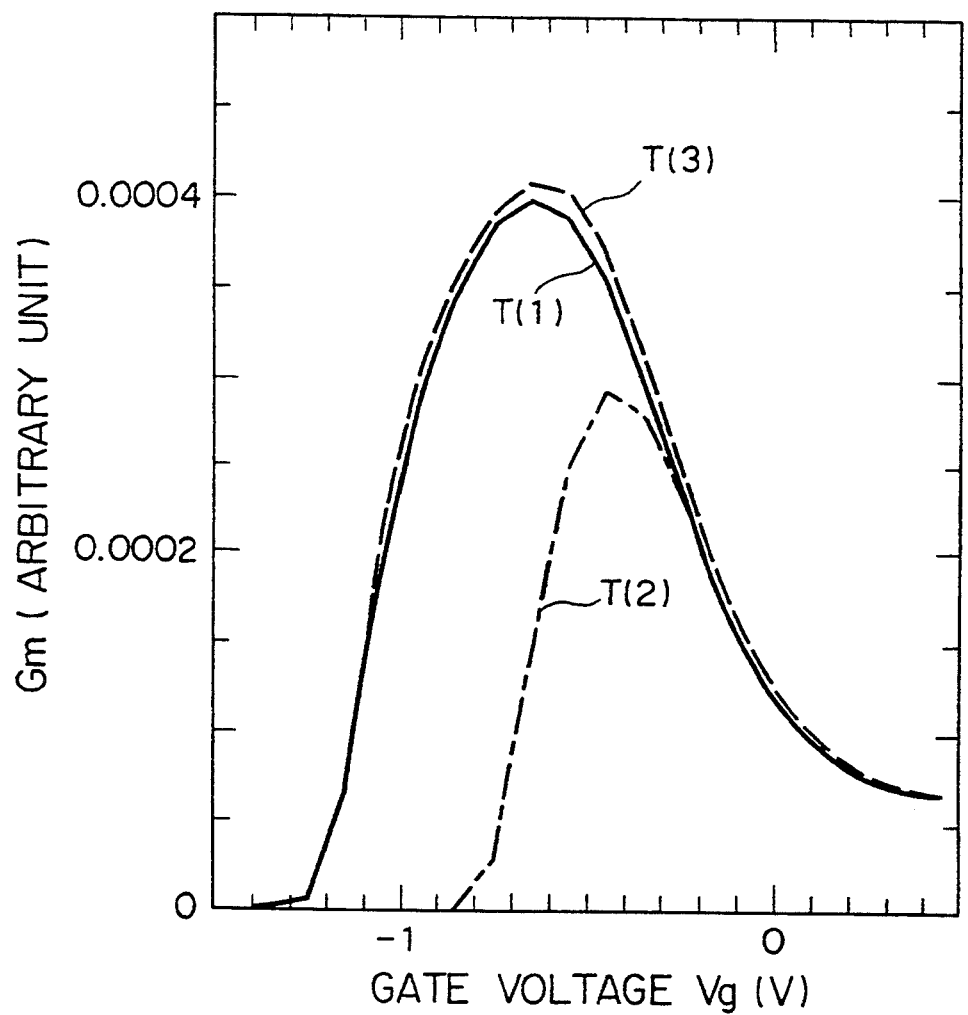
FIG. 6 shows characteristics of the transconductance Gm versus the gate voltage Vg in the field effect transistors illustrated in FIGS. 1 through 3 under condition of a low drain electric field.

FIG. 6 shows characteristics of transconductance Gm versus the gate voltage Vg in the field effect transistors illustrated in FIGS. 1 through 3 under condition of a low drain electric field. In FIG. 6, the abscissa and the ordinate represent the gate voltage Vg (V) and the transconductance Gm (arbitrary unit), respectively. In FIG. 6, T(1), T(2), and T(3) represent the characteristics of transconductance Gm in the FET's shown in FIGS. 1 through 3, respectively.

In FIG. 4, energy band raises about 50 through 400 nm below the channel in the buffer region including the p-type layer as shown in the energy Ec(1) and Ec(2) of the conduction band of FIG. 4. In addition, the buffer region including the p-type layer has reduced electron density about 50 through 400 nm below the channel as shown in the electronic distribution D(1) and D(2) of FIG. 5. Reduction of the electron density reduces a change of charge amount in an electron trap due to variations in the substrate potential. As a result, the FET's having the p-type buffer layer can prevent variations in the transistor characteristics resulting from response of the electron trap.

As shown at the transconductance Gm under the low electric field in FIG. 6, the threshold voltage which defines transition of the drain current rises in the buffer region consisting of the p-type layer alone as shown at the characteristic T(2) of transconductance Gm in FIG. 6. On contrast of this, the FET having the buffer region according to this invention has the threshold voltage as shown in the characteristic T(1) of transconductance Gm. This threshold voltage is similar to that of the FET having the undoped buffer layer as shown at the characteristic T(3) of transconductance Gm in FIG. 6. It is therefore possible to prevent reduction of the current. As well known in the art, the DX center is the deep level caused as a result of doping of n-type impurities of Group IV and Group VI dopant in AlGaAs, which is responsible for a large lattice relaxation. The threshold voltage used herein is implemented so that the carrier supplying layer of $Al_{0.2}Ga_{0.8}As$ without an influence of the DX center substantially has the maximum carrier density. Reduction of the carrier density cannot be compensated without a design of the buffer region.

In addition, there is no accumulation of holes in all of the buffer region. In other words, holes or carrier of the second conductive type are depleted in the whole of the buffer region at the thermal equilibrium. Furthermore, almost all electrons flow in the channel layer 16 without reduction of mobility.

As apparent from the above-description, in order to maintain high mobility in the channel the p-type impurity and the n-type impurity should have the same surface density in the buffer region. This prevents storing of holes and prevents reduction of channel charge density. As understood from the above-description, nearly equality in the surface density means that the surface density of charges in the p-type GaAs layer 13 and the n-type GaAs layer 15 coincides with each other within a range calculated to maintain high mobility. In particular, this range may be defined as a difference of $\pm 5 \times 10^{11}/cm^2$. In this embodiment, inasmuch as each of the p-type GaAs layer 13 and the n-type GaAs layer 15 has the thickness of 100 angstroms and the impurity concentration of $1 \times 10^{18}/cm^3$, its surface density is equal to $10^{12}/cm^2$ and lies within the range of about $\pm 50\%$. When both of them have the thickness of 500 angstroms and the impurity concentration of $1 \times 10^{17}/cm^3$, its surface density becomes $5 \times 10^{11}/cm^2$ and therefore lies within the range of about $\pm 100\%$.

In addition, in order to prevent storing of holes in the buffer region, it is important to not only control both of the impurity concentration in the p-type GaAs layer 13 and the n-type GaAs layer 15 but also control the thickness of the undoped GaAs layer (the i-GaAs) 14 between the n-type GaAs layer (the n-GaAs) 15 and the p-type GaAs layer (the p-GaAs) 13. When the thickness of the undoped GaAs layer 14 is too thick, holes are stored in the buffer region. When the thickness of the undoped GaAs layer 14 is too thin, electron density increases in the buffer layer and it is therefore easy to be affected by the deep level. Preferably, this thickness may be determined so that a step of potential in the n-i-p layer is about a half of band interval.

The n-i-p layer may be located anywhere in the buffer region. In particular, the buffer region may comprise the n-i-p layer, an insertion layer, such as an undoped GaAs layer, a hetero-growth layer, and so on in consideration of the epitaxial growth. The insertion layer may be laid on a top or a bottom surface of the n-i-p layer. The insertion layer may be laid in the vicinity of the channel defining the reference potential to raise the potential of the FET. The insertion layer may be laid in the vicinity of the place where the p-type layer and the interface level exist to eliminate the influence of the deep level. That is, the insertion layer has the optimum position which differs according to conditions.

While this invention has thus far been described in conjunction with only one preferred embodiment thereof, it will now be readily possible for those skilled in the art to put this invention into practice in various other manners. For example, the field effect transistor may be the p-channel FET in which the n-type layer and the p-type layer are inverted as compared with the n-channel FET. It is always unnecessary that the p-type GaAs layer 13, the undoped layer 14, and the n-type GaAs layer 15 have the crystal material which is similar to that of the semi-insulating substrate 11. Crystal material having the wider band interval such as AlGaAs may be used as this crystal material. In this event, it results in reduction of carrier concentration in like manner to a hetero-buffer layer.

What is claimed is:

1. A heterojunction field effect transistor of a first conductive type comprising:
   a substrate having a principal surface;
   a buffer region deposited on the principal surface of said substrate, said buffer region comprising a first impurity-doped layer of a second conductive type, an undoped layer laid on said first impurity-doped layer, and a second impurity-doped layer of the first conductive type laid on said undoped layer, said first impurity-doped layer of the second conductive type having substantially the same impurity concentration per unit area as said second impurity-doped layer of the first conductive type, carriers of the second conductive type being depleted in the whole of said buffer region at thermal equilibrium;
   a channel layer deposited on a top surface of said buffer region; and
   a carrier supplying layer deposited on a top surface of said channel layer.

2. A heterojunction field effect transistor as claimed in claim 1, wherein said first conductive type is an n-type, said first impurity-doped layer of the second conductive type being a p-type GaAs layer, said undoped layer being an undoped GaAs layer, and said second impurity-doped layer of the first conductive type being an n-type GaAs layer.

3. A heterojunction field effect transistor as claimed in claim 1, wherein said first conductive type is a p-type, said first impurity-doped layer of the second conductive type being an n-type GaAs layer, said undoped layer being an undoped GaAs layer, and said second impurity-doped layer of the first conductive type being a p-type GaAs layer.

* * * * *

UNITED STATES PATENT AND TRADEMARK OFFICE
CERTIFICATE OF CORRECTION

PATENT NO. : 5,389,802
DATED : February 14, 1995
INVENTOR(S) : Yasuo Ohno

It is certified that error(s) appears in the above-identified patent and that said Letters Patent is hereby corrected as shown below:

Column 5, line 2 delete "layer" and insert --region--.

Signed and Sealed this

Twenty-first Day of November, 1995

*Attest:*

BRUCE LEHMAN

*Attesting Officer*  *Commissioner of Patents and Trademarks*